United States Patent [19]

Ohbayashi et al.

[11] Patent Number: 4,783,391

[45] Date of Patent: * Nov. 8, 1988

[54] RADIATION-SENSITIVE POLYAMIDE POLYMER COMPOSITION WITH ANTHRAQUINONE MONOAZIDE

[75] Inventors: Gentaro Ohbayashi, Kusatsu; Susumu Umemoto, Yokohama; Hiroo Hiramoto, Otsu, all of Japan

[73] Assignee: Toray Industries, Inc., Tokyo, Japan

[*] Notice: The portion of the term of this patent subsequent to Aug. 26, 2003 has been disclaimed.

[21] Appl. No.: 934,653

[22] Filed: Nov. 25, 1986

Related U.S. Application Data

[62] Division of Ser. No. 640,664, Aug. 14, 1984, abandoned.

[30] Foreign Application Priority Data

Aug. 17, 1983 [JP] Japan ................. 58-149169

[51] Int. Cl.⁴ .................. G03C 1/71; G03C 1/72; G03C 1/52; G03C 1/70
[52] U.S. Cl. ................... 430/196; 430/194; 430/197; 430/325; 430/330; 430/167
[58] Field of Search ............. 430/196, 197, 194, 167, 430/330, 325

[56] References Cited

U.S. PATENT DOCUMENTS

| | | | |
|---|---|---|---|
| 3,595,656 | 7/1971 | Ruckert et al. | 430/197 |
| 4,097,283 | 6/1978 | Asano et al. | 430/197 |
| 4,243,743 | 1/1981 | Hiramoto et al. | 430/281 |
| 4,424,325 | 1/1984 | Tsunoda et al. | 526/245 |
| 4,451,551 | 5/1984 | Kataoka et al. | 430/197 |
| 4,465,768 | 8/1984 | Ueno et al. | 430/197 |
| 4,469,778 | 9/1984 | Iwayanagi et al. | 430/197 |
| 4,547,455 | 10/1985 | Hiramoto et al. | 430/197 |
| 4,608,333 | 8/1986 | Ohbayashi et al. | 430/197 |

FOREIGN PATENT DOCUMENTS

| | | | |
|---|---|---|---|
| 594690 | 3/1960 | Canada | 430/197 |
| 65352 | 11/1982 | European Pat. Off. | 430/197 |

*Primary Examiner*—Charles L. Bowers, Jr.
*Attorney, Agent, or Firm*—Austin R. Miller

[57] ABSTRACT

A radiation-sensitive composition is described, which is comprised of (1) a polymer containing repeating units of the formula:

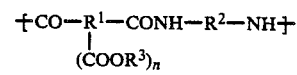

wherein $R^1$ is a trivalent or tetravalent aromatic or heteroaromatic residue having 6 to 30 carbon atoms, $R^2$ is a divalent aromatic or heteroaromatic residue having 6 to 30 carbon atoms, $R^3$ is hydrogen or an ammonium ion, n is 1 or 2, and $COOR^3$ is located in an ortho or peri position with respect to the amide linkage, (2) an organic compound having a radiation-dimerizable or radiation-polymerizable olefinic double bond and an amino radical or a quaternary ammonium salt, and (3) an aromatic monoazide compound [III] having no substituent or having a neutral or acidic substituent. This composition has a highly improved radiation sensitivity and the sensitive wavelength region of this composition is very broad. This composition can give a highly heat-resistant relief pattern with a good edge sharpness. Heat-resistant relief patterns obtained from this composition are especially useful as insulating passivation or protective coatings in semiconductor devices.

18 Claims, No Drawings

RADIATION-SENSITIVE POLYAMIDE POLYMER COMPOSITION WITH ANTHRAQUINONE MONOAZIDE

This is a division, of application Ser. No. 640,664, filed Aug. 14, 1984, abandoned.

BACKGROUND OF THE INVENTION (1) Field of the Invention

The present invention relates to a polymer composition having excellent radiation sensitivity, which is a precursor of a heat-resistant polymer.

(2) Description of the Prior Art

As the polyimide precursor composition having a radiation sensitivity, especially a light sensitivity, the following compositions developed for the formation of insulating layers or passivation layers of semiconductors are known.

(a) A composition comprising a polyamide acid and 1 to 5% by weight of a dichromate (see, for example, U.S. Pat. No. 3,623,870).

(b) A polyimide precursor composition in which a light-sensitive group has been introduced through an ester group having a structure represented by the following formula (see, for example, U.S. Pat. No. 3,957,512 and U.S. Pat. No. 4,040,831):

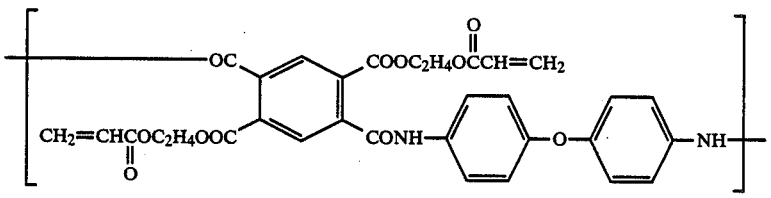

(c) A composition comprising a polyamide acid and a compound having a carbon-to-carbon double bond and an amino group or quaternary salt thereof, which is dimerizable or polymerizable with radiation (see, for example, Japanese Unexamined Patent Publication (Kokai) No. 54-145,794).

According to each of these conventional techniques, a varnish formed by dissolving a composition as described above into an appropriate organic solvent is coated and dried on a substrate to form a coating film, and the film is then irradiated with ultraviolet rays through an appropriate photomask and subjected to developing and rinsing treatments to obtain an intended relief pattern.

A patterned film of a polyimide precursor is subjected to an appropriate heat treatment to convert it to a polyimide film having a heat resistance.

Although these conventional compositions are advantageous in that patterning can be accomplished directly by irradiation with light, they are still insufficient. For example, the composition (a) has a poor stability, and the composition (a) must be used just after the polyamide acid is mixed with dichromic acid; considerably limiting industrial utilization. Furthermore, in case of the composition (a), since inorganic ions are present in the patterned film formed from this composition, the patterned film cannot be used in the field of semiconductors, where the reliability of such devices is seriously influenced by the presence of the inorganic ions.

In the composition (b), the constituent polymer is formed mainly by reacting a compound having a photosensitive group and a dibasic acid chloride group with a diamine, and the steps of forming this polymer are complicated. Furthermore, since the chlorine ion generated by dehydrochlorination is left in the film, there is a risk that possible adverse effects arising from the presence of the chlorine ion will deteriorate the reliability of the semiconductor devices.

In the composition (c), the foregoing defects are moderated, but the sensitivity is so low that an exposure quantity as large as several hundred $mJ/cm^2$ is necessary and, hence, the composition cannot be treated sufficiently by a light exposure apparatus customarily used in the semiconductor industry.

SUMMARY OF THE INVENTION

It is a primary object of this invention to provide a polymer composition which comprises a precursor of a heat resistant polymer and has an improved radiation-sensitivity.

Another object of this invention to provide a polymer composition which comprises a precursor of a heat resistant polymer and has an improved sensitivity to light having relatively long wavelengths.

More specifically, in accordance with this invention, there is provided a radiation-sensitive composition comprising:

(1) a polymer [I] containing repeating units represented by the following formula (A):

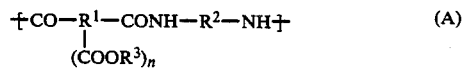

wherein $R^1$ is a trivalent or tetravalent aromatic or heteroaromatic residue having 6 to 30 carbon atoms, $R^2$ is a divalent aromatic or heteroaromatic residue having 6 to 30 carbon atoms, $R^3$ is a hydrogen atom or an ammonium ion, and n is an integer of 1 or 2, and $COOR^3$ is located in an ortho or peri position with respect to the amide linkage, (2) an organic compound [II] having a radiation-dimerizable or radiation-polymerizable olefinic double bond and an amino radical or a quaternary ammonium salt, and (3) an aromatic monoazide compound [III] having no substituent or having a neutral or acidic substituent; and having 6 to 30 carbon atoms.

DETAILED DESCRIPTION OF THE PREFERRED EMBODIMENTS

The polymer having repeating units of the formula (A) is a polymer having a structure represented by the above general formula (A), which is converted by heating or in the presence of an appropriate catalyst to a heat-resistant polymer having an imide ring or other cyclic structure.

In the above-mentioned formula (A), $R^1$ is a trivalent or tetravalent aromatic or heteroaromatic residue having 6 to 30 carbon atoms. A tetravalent aromatic or hetero-aromatic residue is preferred as $R^1$ from the viewpoint of the heat resistance of the resulting polyimide.

As preferred examples of $R^1$, there can be mentioned aromatic residues such as a benzene residue, a naphthalene residue and a biphenyl compound residue of the following formula:

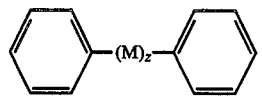

wherein
M is —O—, —SO$_2$—, —CH$_2$—,

or —CO— and
z is an integer of 0 or 1.
Especially preferred examples of $R^1$ are

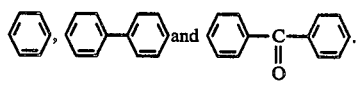

As another preferred example of $R^1$, there can be mentioned a heteroaromatic residue such as a pyrazine residue.

The polymer [I] containing repeating units (A) may be either a polymer containing one kind of $R^1$ as mentioned above or a polymer containing two or more kinds of $R^1$ in the molecule.

$R^2$ is a divalent aromatic or hetero-aromatic residue having 6 to 30 carbon atoms.

As preferred examples of $R^2$, there can be mentioned a benzene residue a biphenyl compound residue of the following formula:

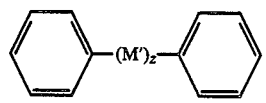

wherein
M' is —O—, —SO$_2$—, —CH$_2$—,

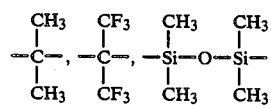

or —CO— and
z is an integer of 0 or 1, and a polyphenyl compound residue of the following formula:

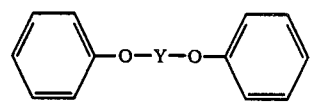

wherein Y is

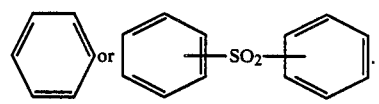

As another preferred example of $R^2$, there can be mentioned a heteroaromatic residue such as that of the following formula:

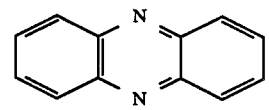

The benzene ring of $R^2$ may contain substituents such as, for example, an amino group, an amide group, a carboxyl group, a sulfonic acid group and a sulfonamide group, so long as these substituents give no bad effect on the heat resistance of the resulting polyimide. As preferred examples of $R^2$ containing a substituent, there can be mentioned

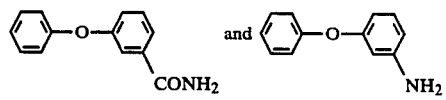

Especially preferred examples of $R^2$ are

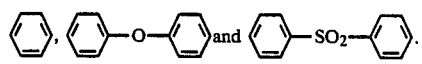

The polymer [I] containing repeating units (A) may be either a polymer containing one kind of $R^2$ as mentioned above or a copolymer containing two or more kinds of $R^2$ in the molecule. In the copolymer, at least one kind of the repeating units may contain as $R^2$ an unsubstituted divalent aromatic or heteroaromatic residue and at least one kind of the repeating units may contain as $R^2$ a substituted divalent aromatic or heteroaromatic residue.

$R^3$ is hydrogen or a substituted or unsubstituted quaternary ammonium ion.

Incidentally, in the formula (A), the group $(COOR^3)_n$ should be located at an ortho-position or peri-position with respect to the amide linkage.

Furthermore, the polymer may contain a small proportion of an aliphatic divalent group having a siloxane structure as $R^2$, so long as the heat resistance of the resulting polyimide is not significantly degraded. A typical instance of this aliphatic divalent group is as follows:

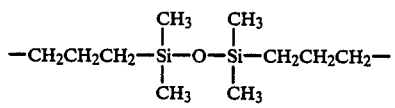

The polymer [I] having repeating units (A) may be prepared by the reaction between a dianhydride and a diamine. Preferred examples of the polymer [I] include a reaction product between pyromellitic dianhydride and 4,4'-diaminodiphenyl ether, a reaction product or pyromellitic dianhydride and 3,3',4,4'-benzophenonetetracarboxylic dianhydride with 4,4'-diaminodiphenyl ether, a reaction product between 3,3',4,4'-benzophenonetetracarboxylic dianhydride and 4,4'-diaminodiphenyl ether, a reaction product between 3,3',4,4'-biphenyltetracarboxylic dianhydride and 4,4'-diaminodiphenyl ether, a reaction product of 3,3',4,4'-biphenyltetracarboxylic dianhydride and 3,3',4,4'-benzophenonetetracarboxylic dianhydride with 4,4'-diaminodiphenyl ether, a reaction product between pyromellitic dianhydride and 3,3'- or 4,4'-diaminodiphenylsulfone, a reaction product of pyromellitic dianhydride and 3,3'-4,4'-benzophenone-tetracarboxylic dianhydride with 3,3'- or 4,4'-diaminodiphenylsulfone, a reaction product between 3,3',4,4'-benzophenone-tetracarboxylic dianhydride and 3,3'- or 4,4'-diaminodiphenylsulfone, a reaction product between 3,3',4,4'-biphenyltetracarboxylic dianhydride and 3,3'- or 4,4'-diaminodiphenylsulfone, a reaction product of 3,3',4,4'-biphenyltetracarboxylic dianhydride and 3,3',4,4'-benzophenone-tetracarboxylic dianhydride with 3,3'- or 4,4'-diaminodiphenylsulfone a reaction product of pyromellitic dianhydride with 4,4'-diaminodiphenylether and bis(3-aminopropyl)tetramethyldisiloxane, a reaction product of pyromellitic dianhydride and 3,3',4,4'-benzophenonetetracarboxylic dianhydride with 4,4'-diaminodiphenyl ether and bis(3-aminopropyl)tetramethyldisiloxane, a reaction product of 3,3',4,4'benzophenonetetracarboxylic dianhydride with 4,4'-diaminodiphenyl ether and bis(3-aminopropyl)tetramethyldisiloxane, a reaction product of 3,3',4,4'-biphenyltetracarboxylic dianhydride with 4,4'-diaminodiphenyl ether and bis(3-aminopropyl)tetramethyldisiloxane, a reaction product of 3,3',4,4'-bisphenyltetracarboxylic dianhydride and 3,3',4,4'-benzophenone-tetracarboxylic dianhydride with 4,4'-diaminodiphenyl ether and bis(3-aminopropyl)tetramethylsiloxane, a reaction product of pyromellitic dianhydride with 3,3'- or 4,4'-diaminodiphenylsulfone and bis(3-aminopropyl)tetramethyldisiloxane, a reaction product of pyromellitic dianhydride and 3,3',4,4'-benzophenone-tetracarboxylic dianhydride with 3,3'- or 4,4'-diaminodiphenylsulfone and bis(3-aminopropyl)tetramethyldisiloxane, a reaction product of 3,3',4,4'-benzophenonetetracarboxylic dianhydride with 3,3'- or 4,4'-diaminodiphenylsulfone and bis(3-aminopropyl)tetramethyldisiloxane, a reaction product of 3,3',4,4'-biphenyltetracarboxylic dianhydride with 3,3'- or 4,4'-diaminodiphenylsulfone and bis(3-aminopropyl)tetramethyldisiloxane, and a reaction product of 3,3',4,4'-biphenyltetracarboxylic dianhydride and 3,3',4,4'-benzophenonetetracarboxylic dianhydride with 3,3'- or 4,4'-diaminodiphenylsulfone and bis(3-aminopropyl)tetramethyldisiloxane.

The polymer [I] is either a homopolymer or copolymer derived only from repeating units of the above formula (A), or a copolymer of repeating units of the formula (A) and other repeating units (B). In case of the latter-mentioned copolymer, in order to achieve the objects of this invention, the other repeating units (B) are preferably selected from those which do not significantly degrade the thermostability of the resulting polyimide derived from the polymer [I] by heat curing. An example of the copolymer comprised of repeating units (A) and (B) is poly(amid amic acid). Preferred examples of the other repeating units (B) are those represented by the following formula:

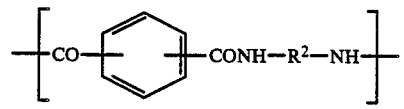

wherein $R^2$ is a divalent organic group having at least 2 carbon atoms, preferred examples of which are selected from those mentioned with respect to $R^2$ in the formula (A).

The organic compound [II] has a radiation-dimerizable or radiation-polymerizable olefinic double bond and an amino radical or a quaternary ammonim salt.

The following compounds [II-a] through [II-d] can be mentioned as typical examples of the organic compound [II].

[II-a]

A compound represented by the following formula:

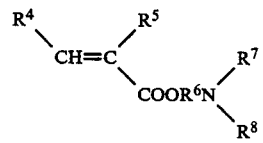

wherein $R^4$ is hydrogen or a phenyl group, $R^5$ is hydrogen or an alkyl group having 1 to 2 carbon atoms, $R^6$ is an alkylene group having 2 to 12 carbon atoms, and each of $R^7$ and $R^8$ is an alkyl group having 1 to 6 carbon atoms.

[II-b]

A compound represented by the following formula:

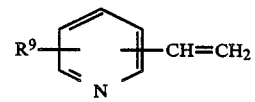

wherein $R^9$ is hydrogen or an alkyl group having 1 to 6 carbon atoms.

[II-c]

A compound represented by the following formula:

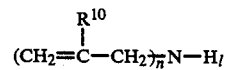

wherein $R^{10}$ is hydrogen or a methyl group, n is an integer of from 1 to 3, and the sum of l and n is 3.

[II-d]

Quaternary salts of the foregoing compounds and mixtures thereof.

Other examples of the compound [II] are 2-vinylquinoline, 4-vinylquinoline, allyltriethylammonium chloride, 1-allylimiadazole, 2-isopropenylimidazole, 1-vinylimidazole, 1-methallylimidazole, 1-allylbenzimidazole, 2-vinylimidazole, 1-methallylbenzimidazole, 1-vinylpyrazole, 1-allylpyrazole, 1-methallylpyrazole, 1-vinylpyrole, 2-methyl-5-vinylpyrole, 2-morpholinoethylacrylate and 4,6-dimethyl-2-vinylpyridine.

Preferred examples of the organic compound [II] are diethylaminoethyl methacrylate diethylaminoethyl acrylate, dimethylaminoethyl methacrylate, dimethylaminoethyl acrylate, 2-vinylpyridine, 2-methyl-5-vinylpyridine, allylamine and methallylamine. From the viewpoint of the photosensitivity, acrylic esters or methacrylic esters are especially preferable.

In the case of a compound [II] having an amino group and an olefinic double bond, it is desirable to combine the compound [II] with a polymer [I] in which $R^3$ of the repeating units (A) is hydrogen. In the case of a compound [II] having a quaternary ammonium salt and an olefinic double bond, it is desirable to combine the compound [II] with a polymer [I] in which $R^3$ of the repeating units (A) is an ammonium ion.

It is preferred that the compound [II] be mixed with the polymer [I] having the main recurring units (A) in such an amount that the amount of the compound [II] be at least 0.05 equivalent, especially at least 0.3 equivalent, to the whole carboxyl or carboxylate groups of the polymer [I] having the main structural units (A) and be not larger than 2 equivalents. If the amount of the compound [II] is outside this range, the photosensitivity is reduced or the allowable ranges of developing conditions such as the developing time and temperature are narrowed.

When the compound [II] is used in combination with a monomer copolymerizable therewith, such as monomaleimide, polymaleimide or a substitution product thereof, the radiation sensitivity is improved and better results are obtained.

The aromatic monoazide compound [III] having no substituent or having a neutral or acidic substituent is a compound in which the azide group (—N₃) is directly bonded to the aromatic ring and only one azide group is present in one molecule. By the aromatic ring are meant a benzene ring, a naphthalene ring, an anthracene ring, a naphthoquinone ring, and an anthraquinone ring. These aromatic rings have no substituent other than the azide group, or they are substituted with a neutral or acidic substituent. Furthermore, an azide compound [III] in which an aromatic ring such as mentioned above is bonded to another aromatic ring having no substituent or having a neutral or acidic substituent through a divalent group such as

—O—, —C—, —SO₂—, —CH₂—, —CH=CH—,
    ‖
    O

—CH=CH—C— or —C—CH=CH—
         ‖       ‖
         O       O is preferably used.

The neutral or acidic group is a group not forming a salt with an organic carboxylic acid, and this substituent does not include an amino group or an amino group-containing substituent. As the neutral or acidic substituent, there can be mentioned an alkyl group having 1 to 6 carbon atoms, an alkoxy group having 1 to 6 carbon atoms, a nitro group, a halogen group, an acyl group, an acyloxy group, a carboxyl group, a sulfonic group, and an alkyl group substituted with a neutral or acidic group.

Accordingly, the compound [III] has ordinarily 6 to 30 carbon atoms and preferably 6 to 21 carbon atoms.

Preferred examples of the compound [III] are as described below, although the compounds [III] that can be used are not limited to those exemplified below:

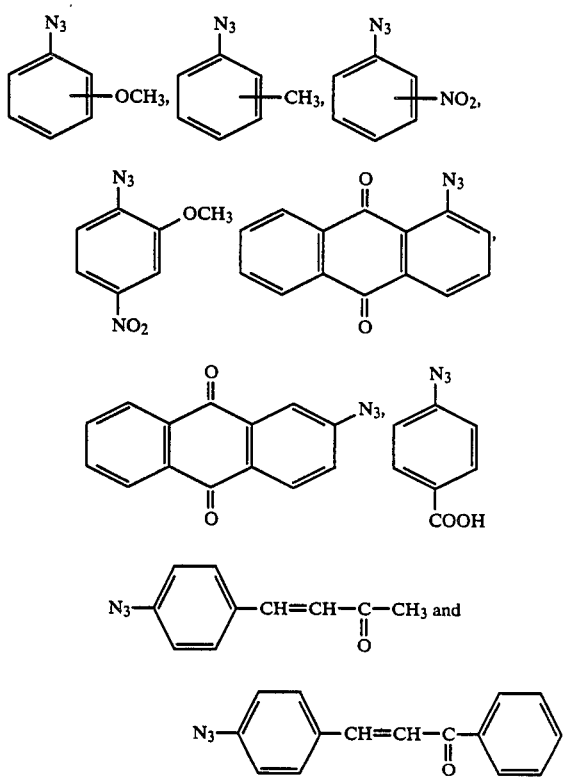

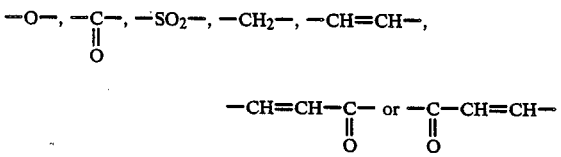

These aromatic monoazide compounds [III] may be used alone or in the form of a mixture of two or more.

It is preferred that the aromatic monoazide compound [III] be used in an amount of 0.1 to 30% by weight, especially 0.5 to 15% by weight, based on the polymer having the main structural units [I]. If the amount of the aromatic azide compound [III] is outside the above range, the developing property or the stability of the composition probably will be degraded.

A polymer [I] having repeating units of the formula (A) is prepared by reacting a diamine with a diahydride of a tetracarboxylic acid in a suitable organic solvent. A compound [II] is mixed into the polymer solution. Then, a compound [III] dissolved in a suitable amount of the solvent is mixed into the solution. The so-obtained solution of the radiation-sensitive composition may be diluted so that the desired viscosity is obtained, and be filtered.

In the case of a polymer [I] in which n in the general formula (A) is 1, the solution of the photo- or radiation-sensitive composition of this invention is similarly obtained by mixing a compound [II] in a solution of the polymer [I] and dissolving a compound [III] in the solution.

Typical examples of solvents that can be used for preparing the polymer [I] are N-methyl-2-pyrrolidone, N,N-dimethylformamide, N,N-dimethylacetamide, dimethylsulfoxide, hexamethylphosphoramide, γ-butyrolactone, ethyleneglycol monomethyl ether and ethyleneglycol monoethyl ether. These solvents may be used alone or in the form of mixtures of two or more of them.

Typical solvents that can be used for diluting the photo- or radiation-sensitive composition are the same as those mentioned above with respect to the preparation of the polymer [I]. These solvents may be used alone or in the form of mixtures of two or more of them.

Other additives such as a sensitizer, a copolymerizable monomer and an agent for improving the adhesion to a substrate may be incorporated, so long as the sensitivity of the composition and the heat resistance of the resulting polyimide are not significantly degraded.

A sensitizer such as Michler's ketone or 4,4'-bis(diethylamino)benzophenone may preferably be used in the composition of this invention. In this case the amount of compound [III] may be 0.5 to 10% by weight. By incorporation of the sensitizing agent, the radiation sensitivity of the composition of this invention can further be improved.

In the process for applying the composition of this invention to a substrate, the composition is applied by adopting such means as spin coating using a spinner, immersion coating, spray coating, printing or the like, and the composition is then dried at about 30° to about 100° C. for about 10 minutes to about 5 hours to form a film. The thickness of the so-formed film can be controlled according to the coating technique or by controlling the solid content or viscosity of the solution of the composition or other means.

The film is then exposed imagewise to actinic radiation. Typical actinic radiation sources used are ultraviolet lamps providing radiations having a wavelength of 200 to 500 nanometers. Other actinic radiation such as visible rays, X-rays and electron beams can also be used. Ultraviolet rays and visible rays having a relatively short wavelength, that is, 300 to 500 nm, are preferred.

After the exposure, the film is developed into a relief pattern with a developer which dissolves the unexposed portions.

An example of the developer is a mixture of a solvent for the composition and a non-solvent for the composition. As the solvent, there can be mentioned N,N-dimethylformamide, N,N-dimethylacetamide, N-methylpyrrolidone, dimethylsulfoxide and hexamethylphosphoramide. As the non-solvent, there can be mentioned methanol, ethanol, carbitol, water and methyl cellosolve.

Another example of the developer is an aqueous alkaline solution such as an aqueous solution of ammonia, sodium hydroxide or potassium hydroxide. Still another examples of the developer include solvents used for formation of solutions of the composition of this invention, such as mentioned hereinbefore.

Development is accomplished by spraying a developer such as mentioned above onto the surface of the coated film, or by dipping the coated film in the developer optionally under ultrasonic agitation.

In this invention, it is preferred that the relief pattern formed by the development by rinsed with a rinsing solution to remove the developer. Preferred examples of the rinsing liquid are methanol, ethanol, isopropyl alcohol and butyl acetate.

The relief pattern thus obtained is cured by baking at about 200° to about 400° C. for about 20 minutes to about 4 hours to form a pattern of a highly thermally stable polymer having a heat-stable imide or other ring structure.

As the substrate to which the solution of the composition of this invention is applied, there can be mentioned, for example, metals, glasses, semiconductors, metal oxide insulators (e.g., $TiO_2$, $Ta_2O_5$ and $SiO_2$) and silicon nitride.

A common adhesion promotor may optionally be used so as to improve the adhesion between the substrate and the coating of the composition of this invention or the polyimide film formed by the heat treatment.

As the adhesion promotor, there are preferably used organic silicon compounds such as hydroxypropyltrimethoxysilane, γ-glycidoxypropyltrimethoxysilane, γ-aminopropyltriethoxysilane and γ-methacryloxypropyltrimethoxysilane, aluminum chelate compounds such as aluminum monoethylacetoacetate diisopropylate, aluminum tris(ethylacetoacetate) and aluminum tris(acetylacetate), and titanium chelate compounds such as titanium bis(acetylacetate).

Thus, the radiation-sensitive composition of this invention, can be used for the preparation of passivating layers or insulating layers on semiconductor devices, the preparation of a soldering protective film for a printed circuit, the preparation of an orientation-controlling film for a liquid crystal display device, the preparation of masks for ion implantation or vapor deposition of metals or inorganic compounds which need high temperature vaporization, and the preparation of lift-off patterns. Furthermore, the composition can be used as a dry etching-resistant photoresist and a radiation-sensitive resist.

The radiation sensitivity of the composition of this invention is evaluated according to the well-known step tablet method using Kodak No. 2 step tablet (manufactured by Eastman Kodak Co.). More specifically, a film of the composition on a substrate is exposed to ultraviolet rays through the step tablet and then, development is carried out. The step number at which the film is left with a minimum light quantity is checked. In this step tablet, as the step number is increased by 1, the quantity of transmitted light is reduced to $1/\sqrt{2}$ of the quantity at the preceding step number. Accordingly, the larger is the step number, the higher is the sensitivity.

As is apparent from the foregoing description, the photo- or radiation-sensitive composition of this invention comprises a polymer [I] having repeating units (A) as the main units, a compound [II] containing an unsaturated bond dimerizable or polymerizable with actinic radiation and an amino group or a quaternary salt thereof and an aromatic monoazide compound [III]. Accordingly, there is attained an effect of highly improving the sensitivity. Furthermore, if an appropriate kind of the aromatic monoazide compound [III] is used in an appropriate amount, the sensitive wavelength region is broadened and selection of the sensitive wavelength region becomes possible.

Furthermore, since no special substituent is necessary for the aromatic monoazide compound [III] to be used in the present invention, the composition of the present invention is advantageous in that it can be easily be prepared and limits for the synthesis are remarkably moderated. Moreover, since an appropriate compound [III] can be chosen among a variety of aromatic monoazide compounds, in preparing the radiation-sensitive composition, the sensitivity, the sensitive wavelength region, and other specific properties can be optionally adjusted according to need.

By the term "heat resistance" used herein, it is meant that even if a formed relief pattern is heated at 200° C.

in a nitrogen atmosphere for one hour, the relief pattern does not become obscure nor any significant loss caused in the weight of the relief pattern by heating.

The invention will now be described in detail with reference to the following examples. These examples by no means limit the scope of the invention.

solution of an aromatic monoazide compound (together with a sensitizer when used) in N-methylpyrrolidone, and the mixture was then filtered.

A film was formed on a silicon wafer in the same manner as described in Example 1 by using the thus-obtained solution.

TABLE 1

| Example No. | Aromatic Monoazide Compound | | Sensitizer | | Sensitivity (step number) |
|---|---|---|---|---|---|
| | Kind | Amount (% by weight) | Kind | Amount (% by weight) | |
| 2 | 2-Azidoanthraquinone | 3.2 | — | — | 6 |
| 3 | 4-Azidobenzalaceto-phenone | 4.0 | — | — | 6 |
| 4 | 4-Azidobenzalaceto-phenone | 6.0 | — | — | 7 |
| 5 | 4-Azidobenzalaceto-phenone | 6.0 | Michler's ketone | 1.5 | 9 |
| 6 | 2-Azido-5-nitro-anisole | 1.5 | Michler's ketone | 1.5 | 7 |
| 7 | 4-Azidobenzoic acid | 1.5 | Michler's ketone | 1.5 | 7 |
| 8 | 2-Azidoanthraquinone | 1.5 | Benzanthrone | 1.5 | 8 |
| 9 | 2-Azidoanthraquinone | 1.5 | 4,4'-Bis(diethyl-amino)benzophenone | 1.5 | 8 |

EXAMPLE 1

In 600 g of N-methyl-2-pyrrolidone was dissolved 68 g of diaminodiphenyl ether to form an amine solution. Then, 108 g of benzophenone-tetracarboxylic dianhydride was dispersed in the solution. Reaction was carried out at 50° C. for 3 hours to obtain a polymer solution (A) having a viscosity of 20 poise as measured at 30° C.

Then, 40 g of the solution (A) was mixed with 5.6 g of diethylaminoethyl methacrylate. A solution of 0.6 g of 4-azidobenzalacetophenone in 5 g of N-methylpyrrolidone was added to the mixture, and the mixture was then filtered.

The obtained solution was spin-coated onto a silicon wafer by a spinner and then dried at 80° C. for 1 hour to obtain a film having a thickness of 5 μm. The coating film was flat and even and adhered tightly to the substrate.

The sensitivity was examined according to the grey scale method. The light exposure was carried out for 10 seconds by a high pressure mercury lamp. The intensity of the ultraviolet rays was 10 mW/cm² at a wavelength of 365 nm. The development was carried out with a mixed solvent of dimethylacetamide (5 parts) and methanol (2 parts) and washing was then carried out with a rinsing liquid. The step number of the minimum exposure quantity where the film was left, that is, the sensitivity, was 7.

EXAMPLES 2 THROUGH 9

In Examples 2 through 9, solutions were prepared by changing the amounts and kinds of the aromatic monoazide compound and sensitizer, and the sensitivities of these solutions were evaluated according to the gray scale method. The obtained results are shown in Table 1.

Note, in Table 1, the content (% by weight) was calculated by dividing the weight of the additive compuond by the weight of the polymer and multiplying the quotient by 100.

The preparation of the solutions and the evaluation of the sensitivity were carried out according to the following procedures.

The solution (A) obtained in Example 1 was mixed with diethylaminoethyl methacrylate and then with a

COMPARATIVE EXAMPLE 1

The polymer solution (A) (40 g) obtained in Example 1 was mixed with a solution of a variable amount of Michler's ketone and 5.6 g of diethylaminoethyl methacrylate in 4.5 g of N-methylpyrrolidone, and the mixture was filtered. The obtained composition was tested in the same manner as described in Example 1. When the test was carried out by adjusting the amount of Michler's ketone in the range of from 0.009 g to 0.9 g, it was found that the sensitizing effect reached the uppermost limit when the amount of Michler's ketone added reached about 0.2 g. The minimum exposure step number where the film was left after the development, that is, the sensitivity, was 4.

EXAMPLE 10

The polymer solution (A) (40 g) obtained in Example 1 was mixed with 5.6 g of dimethylaminoethyl methacrylate. The mixture was mixed with a solution of 0.6 g of 4-azidobenzalacetophenone and 0.2 g of Michler's ketone in 5 g of N-methylpyrrolidone and the resulting mixture was then filtered.

A film was formed on a silicon wafer in the same manner as described in Example 1 by using the thus-formed solution. A mask having a stripe pattern was closely applied to the film and, in the same manner as described in Example 1, the assembly was exposed to ultraviolet rays of the mercury lamp for 5 seconds, followed by development and rinsing, whereby a relief pattern having a sharp end face was obtained. When the relief pattern was heat-treated at 350° C. for 30 minutes, a heat-resistant relief pattern was obtained. Even if this pattern was heat-treated at 200° C. for 1 hour, the pattern did not become obscure nor was any loss in weight caused by the heat treatment observed.

EXAMPLE 11

A film was formed on a silicon wafer in the same manner as described in Example 1 by using the radiation-sensitive composition obtained in Example 10.

A mask of a striped pattern was closely applied to the film, and the assembly was exposed to ultraviolet rays from the mercury lamp used in Example 1 through an interference filter selectively allowing permeation of rays having a wavelength of 435 nm. The exposure quantity was 200 mJ/cm². The developing and rising treatments were carried out in the same manner as described in Example 1. A relief pattern having a sharp end face was obtained.

The above procedures were repeated in the same manner by using the composition prepared in Comparative Example 1. The film was completely dissolved out and no pattern could be obtained.

From the foregoing results, it is apparent that the sensitivity region is broadened to a wavelength as long as 435 nm by using an aromatic monoazide compound.

EXAMPLE 12

In 600 g of N-methyl-2-pyrrolidone was dissolved 68 g of diaminodiphenyl ether and 3.5 g of bis(3-aminopropyl)tetramethyldisiloxane to form an amine solution. Then, 114 g of benzophenone-tetracarboxylic dianhydride was dispersed in the solution. Reaction was carried out at 50° C. for 3 hours to obtain a polymer solution (B).

The polymer solution (B) (40 g) obtained in Example 1 was mixed with 5.6 g of dimethylaminoethyl methacrylate. The mixture was mixed with a solution of 0.6 g of 4-azidobenzalacetophenone and 0.2 g of Michler's ketone in 5 g of N-methylpyrrolidone and the resulting mixture was then filtered.

A film was formed on a silicon wafer in the same manner as described in Example 1 by using the thus-formed solution. A mask having a stripe pattern was closely applied to the film and, in the same manner as described in Example 1, the assembly was exposed to ultraviolet rays of the mercury lamp for 5 seconds, followed by development and rinsing, whereby a relief pattern having a sharp end face was obtained. When the relief pattern was heat-treated at 350° C. for 30 minutes, a heat-resistant relief pattern was obtained. Even if this pattern was heat-treated at 200° C. for 1 hour, the pattern did not become obscure nor was any loss in weight caused by the heat treatment observed. It was observed that the pattern was adhered tightly to the substrate.

We claim:

1. A radiation-sensitive composition comprising a mixture of:
 (1) a polymer containing repeating units (A) represented by the following formula:

$$\{CO-R^1-CONH-R^2NH\}$$
$$\quad\quad\ |$$
$$\quad\quad (COOR^3)_n$$
(A)

wherein $R^1$ is a trivalent or tetravalent aromatic or heteroaromatic organic group having 6 to 30 carbon atoms, $R^2$ is a divalent aromatic or heteroaromatic organic group having 6 to 30 carbon atoms, $R^3$ is a hydrogen atom or an ammonium ion, n is an integer of 1 or 2, and $COOR^3$ is located in an ortho or peri position with respect to the amide linkage,
 (2) 0.05 to 2 equivalents, to the whole carboxyl or carboxylate groups of the polymer [I], to an organic compound [II] having a radiation-dimerizable or radiation-polymerizable olefinic double bond and an amino radical or a quaternary ammonium salt, and
 (3) 0.1 to 30% by weight, based on the weight of the polymer [I], of an aromatic monoazide compound

[III] having an aromatic component selected from the group consisting of:

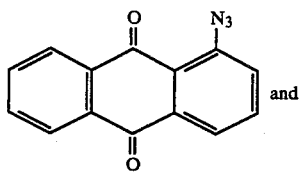

and

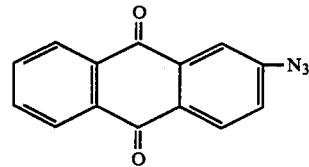

said monoazide compound having no substituent or having a neutral or acidic substituent directly attached to the aromatic ring of the monoazide compound, and having 6 to 30 carbon atoms.

2. A composition as set forth in claim 1, wherein the polymer [I] contains at least two kinds of repeating units.

3. A composition as set forth in claim 1, wherein "n" in the formula (A) is 2.

4. A composition as set forth in claim 1, wherein $R^1$ is a trivalent or tetravalent aromatic residue of a formula selected from the group consisting of

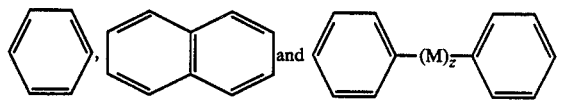

in which M is —O—, —SO₂—, —CH₂—,

or

and z is 0 or 1.

5. A composition as set forth in claim 1, wherein $R^1$ is an aromatic residue of a formula selected from the group consisting of

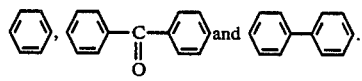

6. A composition as set forth in claim 1, wherein the polymer [I] of the formula (A) contains at least two kinds of $R^2$s.

7. A composition as set forth in claim 1, wherein $R^2$ is a divalent aromatic residue selected from the group consisting of a benzene residue, a biphenyl compound residue of the formula:

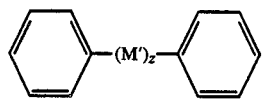

wherein M' is —O—, SO₂—, —CH₂—,

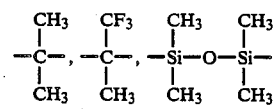

or —CO— and z is an integer of 0 or 1,
and a polyphenyl compound residue of the following formula:

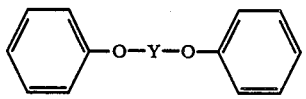

wherein Y is

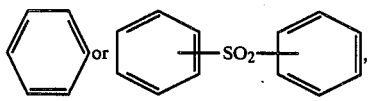

each of which may have no substituent or have a nuclear substituent selected from the group consisting of amino, amide, carboxyl, and sulfone-amide groups.

8. A composition as set forth in claim 1, wherein $R^2$ is a divalent aromatic residue of a formula selected from the group consisting of

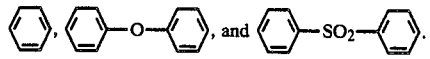

9. A composition as set forth in claim 2, wherein at least one kind of the repeating units contain as $R^2$ an unsubstituted divalent aromatic or heteroaromatic residue and at least one kind of the repeating units contain as $R^2$ a substituted divalent aromatic or heteroaromatic residue.

10. A composition as set forth in claim 1, wherein part of the $R^2$s in the recurring units (A) of the polymer [I] is comprised of a divalent aliphatic residue represented by the formula:

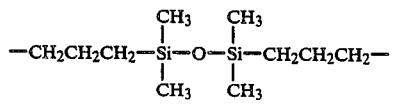

11. A composition as set forth in claim 1, wherein the compound [II] is at least one compound represented by the following formula:

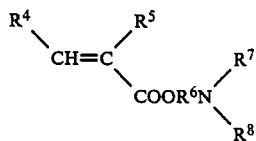

wherein $R^4$ is hydrogen or a phenyl group, $R^5$ is hydrogen or an alkyl group having 1 to 2 carbon atoms, $R^6$ is an alkylene group having 2 to 12 carbon atoms, and each of $R^7$ and $R^8$ is an alkyl group having 1 to 6 carbon atoms.

12. A composition as set forth in claim 1, wherein the compound [II] is at least one compound represented by the following formula:

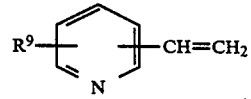

wherein $R^9$ is hydrogen or an alkyl group having 1 to 6 carbon atoms.

13. A composition as set forth in claim 1, wherein the compound [II] is at least one compound represented by the following formula:

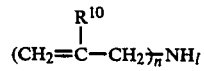

wherein $R^{10}$ is hydrogen or a methyl group, n is an integer of from 1 to 3, and the sum of l and n is 3.

14. A composition as set forth in claim 1, wherein the compound [II] is at least one compound selected from the group consisting of diethylaminoethyl methacrylate, diethylaminoethyl acrylate, dimethylaminoethyl methacrylate, dimethylaminoethyl acrylate, 2-vinylpyridine, 2-methyl-5-vinylpyridine, allylamine and methyllylamine.

15. A composition as set forth in claim 1, wherein the compound [III] is an aromatic monoazide compound having 10 to 21 carbon atoms.

16. A radiation-sensitive polymer composition as set forth in claim 1, wherein the amount of said aromatic monoazide compound is 0.5 to 15% by weight based on the weight of the polymer [I] having the main recurring units (A).

17. A radiation-sensitive polymer composition as set forth in claim 1, wherein said radiation-sensitive polymer composition further comprises a sensitizer selected from the group consisting of Michler's ketone and 4,4'-bis(diethylamino)-benzophenone.

18. A composition as set forth in claim 1, wherein the amount of said compound [II] is 0.3 to 2 equivalents to the whole carboxyl or carboxylate groups of the polymer [I] having the main recurring units (A).

* * * * *